(12) United States Patent
Sirringhaus et al.

(10) Patent No.: US 9,275,856 B2
(45) Date of Patent: Mar. 1, 2016

(54) NANOROD THIN-FILM TRANSISTORS

(71) Applicant: CAMBRIDGE ENTERPRISE LIMITED, Cambridge (GB)

(72) Inventors: Henning Sirringhaus, Coton Cambridge (GB); Baoquan Sun, Cambridge (GB)

(73) Assignee: CAMBRIDGE ENTERPRISE LIMITED, Cambridge (GB)

( * ) Notice: Subject to any disclaimer, the term of this patent is extended or adjusted under 35 U.S.C. 154(b) by 0 days.

(21) Appl. No.: 14/187,729

(22) Filed: Feb. 24, 2014

(65) Prior Publication Data
US 2014/0170818 A1 Jun. 19, 2014

Related U.S. Application Data

(63) Continuation of application No. 12/063,345, filed as application No. PCT/GB2006/002981 on Aug. 9, 2006, now abandoned.

(30) Foreign Application Priority Data

Aug. 9, 2005 (GB) .................................. 0516401.7
Jul. 21, 2006 (GB) .................................. 0614553.6

(51) Int. Cl.
*H01L 21/02* (2006.01)
*B82Y 10/00* (2011.01)
*H01L 29/06* (2006.01)
*H01L 29/66* (2006.01)
*H01L 29/786* (2006.01)

(52) U.S. Cl.
CPC ........... *H01L 21/02524* (2013.01); *B82Y 10/00* (2013.01); *H01L 21/02521* (2013.01); *H01L 21/02554* (2013.01); *H01L 21/02565* (2013.01); *H01L 21/02603* (2013.01); *H01L 21/02628* (2013.01); *H01L 29/0673* (2013.01); *H01L 29/66742* (2013.01); *H01L 29/786* (2013.01); *H01L 29/7869* (2013.01); *H01L 29/78681* (2013.01)

(58) Field of Classification Search
CPC .................................................. H01L 21/02524
USPC ...................... 257/24, 43, E21.461, E29.094, 257/E29.245; 977/938, 773; 438/104
See application file for complete search history.

(56) References Cited

U.S. PATENT DOCUMENTS

| 7,255,846 | B2 | 8/2007 | Ren et al. |
| 7,265,037 | B2 | 9/2007 | Yang et al. |
| 2005/0072213 | A1 | 4/2005 | Besnard et al. |
| 2005/0110064 | A1 | 5/2005 | Duan et al. |
| 2006/0035101 | A1 | 2/2006 | Yuan et al. |
| 2006/0284218 | A1 | 12/2006 | Kaner et al. |
| 2007/0020771 | A1 | 1/2007 | Dutta et al. |
| 2010/0329251 | A1 | 12/2010 | Rodgers et al. |
| 2012/0225006 | A1* | 9/2012 | O'Brien et al. ............... 423/622 |

* cited by examiner

*Primary Examiner* — Fernando L Toledo
*Assistant Examiner* — Neil Prasad
(74) *Attorney, Agent, or Firm* — Sughrue Mion, PLLC

(57) ABSTRACT

A method for forming an electronic switching device on a substrate, wherein the method comprises depositing the active semiconducting layer of the electronic switching device onto the substrate from a liquid dispersion of ligand-modified colloidal nanorods, and subsequently immersing the substrate into a growth solution to increase the diameter and/or length of the nanorods on the substrate, and wherein the as-deposited nanorods are aligned such that their long-axis is aligned preferentially in the plane of current flow in the electronic switching device.

17 Claims, 12 Drawing Sheets

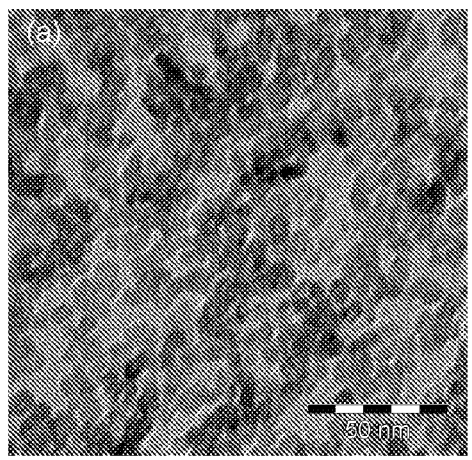 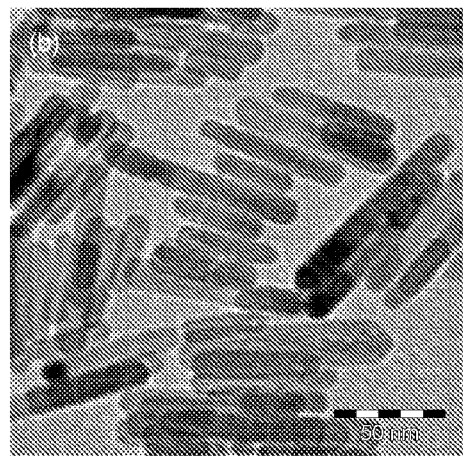
FIG. 1A    FIG. 1B
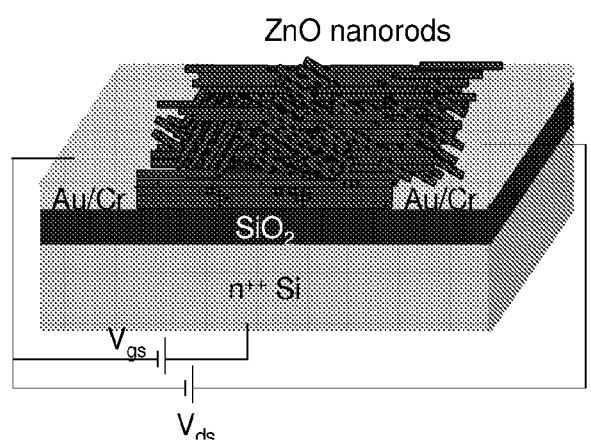
FIG. 12

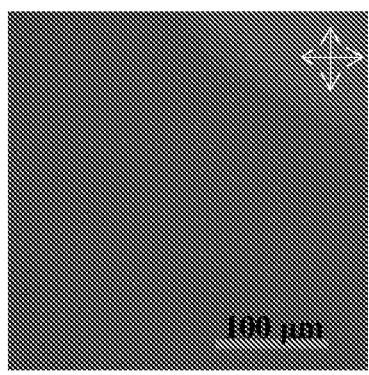 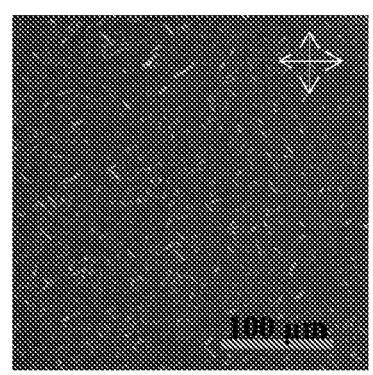
FIG. 7A  FIG. 7B
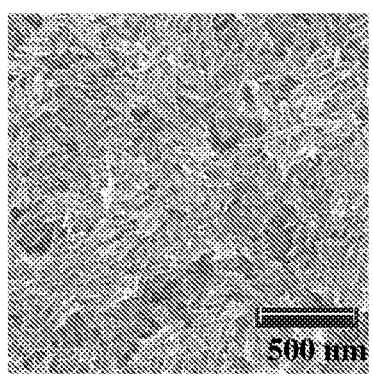 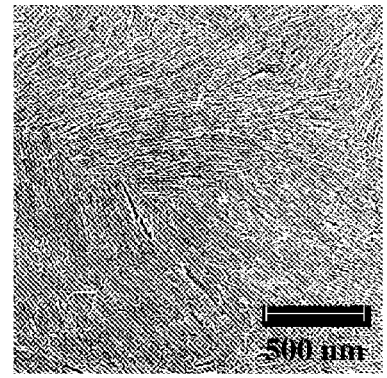
FIG. 7C  FIG. 7D

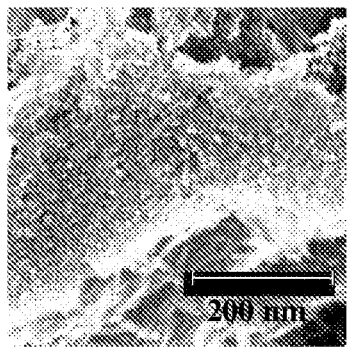
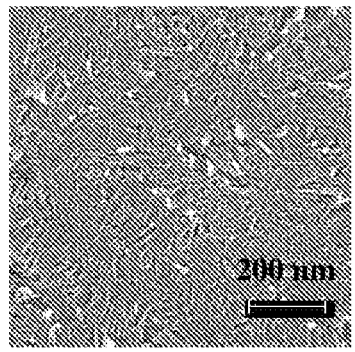
FIG. 8A　　　　　　　　FIG. 8B
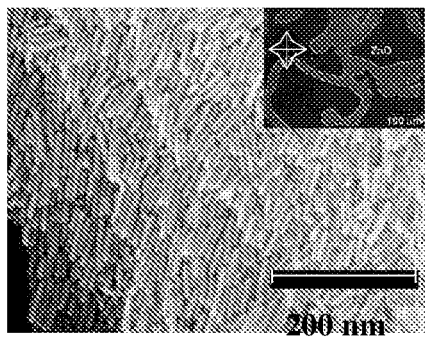
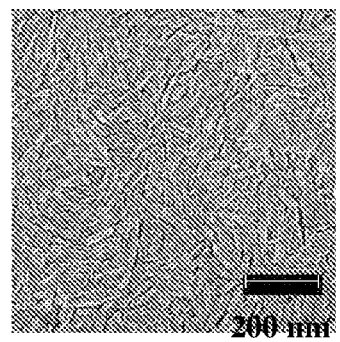
FIG. 8C　　　　　　　　FIG. 8D

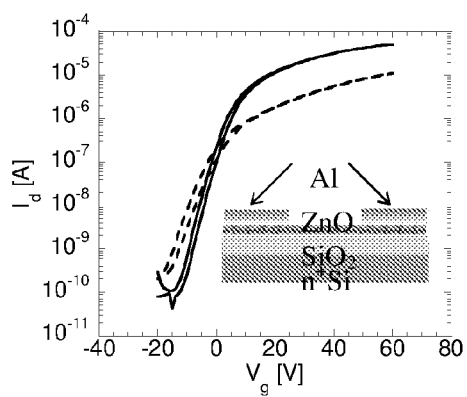
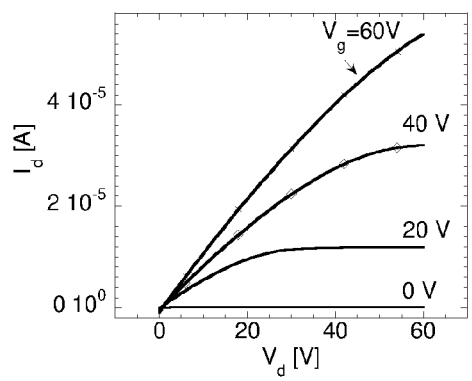
FIG. 10A                    FIG. 10B

| Film | Mole ratio KOH/Zn(Ac)$_2$ | $\mu_{sat}$ $(cm^2V^{-1}s^{-1})$ | On/off ratio | $|V_0|$ (V) |
|---|---|---|---|---|
| a | 1.5 | 1.9e-4 | <2 | - |
| b | 1.62 | 2.3e-2 | 1.1e+5 | 8 |
| c | 1.7 | 8.2e-3 | 4.4e+1 | 9 |

FIG. 11

NANOROD THIN-FILM TRANSISTORS

CLAIM OF PRIORTY

This application is a continuation application and claims priority under 35 U.S.C. §120 to U.S. patent application No. 12/063,345, filed on Jun. 9, 2010, which claims priorty to International Application No. PCT/GB2006/002981, filed on Aug. 9, 2006, which claims priorty to U.K. Application GB0516401.7, filed on Aug. 9, 2005, and also claims priorty to U.K. Application GB0614553.6, filed on Jul. 21, 2006, the entire contents of which are hereby incorporated by reference.

There is significant interest in realizing high-performance thin-film transistors (TFTs) based on solution-processible semiconducting materials for applications requiring low-cost, low-temperature manufacturing on large-area, flexible substrates.[1, 2] Much effort has been devoted to low-temperature, solution processible organic semiconductors as a potential alternative to traditional inorganic semiconductors. OTFTs with mobilities of 0.01-0.1 $cm^2/Vs$, good reliability, stability, and device-to-device uniformity have been demonstrated.[3, 8] There are also various approaches to realizing solution-processible inorganic semiconductors, which provide a potential route to significantly higher mobilities, but for which control of electronic defect states when processed from solution at low temperatures can be challenging.[9] Inorganic semiconductors might also provide a route to high performance n-type TFTs required for complementary circuits, which are traditionally difficult to realize with organic TFTs although much progress has been made recently.[10, 11]

A variety of solution-processible inorganic semiconductors for TFTs have been reported.[9] These include tin(II) iodide based organic-inorganic hybrids[12], chalcogenide semiconductors[13], μm-long semiconductor nanowires[14] and spherical nanocrystals[15]. The semiconductor nanowire/nanocrystal approach is very promising, since it allows to decouple the high-temperature growth/synthesis of the nanowire from the low-temperature device fabrication process, and achieve high performance.

Duan et al.[14] have used μm-long semiconductor nanowires as the active layer of TFTs. The long nanowires have a length comparable to the channel length of the TFT and as a result yield very high electrical performance, but are difficult to disperse into a stable solution. They can be deposited and aligned by sophisticated deposition techniques such as flow in capillaries and Langmuir-Blogett techniques, but they do not form stable dispersions with sufficiently long solution shelf lifetime, and as a result are difficult to deposit over large areas, but standard techniques such as printing, spin-coating, or other large-area coating techniques. Another problem with semiconductor nanowires is the low density of nanowires on the substrate. The typical distance between the nanowires in the film is much larger than the nanowire diameter, and the surface coverage is typically less than 20%.

Ridley et al.[15] have used spherical colloidal nanocrystals of CdSe, which can be drop-cast onto a substrate and can re-melt to form a uniform film after annealing at 350° C. due to lowering of the melting point for these ultra-small nanocrystals.[16] However, the mobility of a thin film of spherical nanocrystals is significantly lower than the maximum achievable bulk mobility of the semiconducting material due to a large number of grain boundaries in the sintered nanocrystal network. This is because the nanoparticle diameter needs to be kept small (typically less than 10 nm) in order to be able to sinter the particles by the surface melting mechanism.

Another problem with the spherical colloidal nanoparticle approach is that it requires still relatively high annealing temperatures for the sintering process. CdSe nanocrystal devices shows m-type behaviour with mobility of 1 $cm^2V^-1s^{-1}$ and on/off ratio of $3.1\times10^4$ after annealing at 350° C. and on/off ratio of $3.1\times10^4$ after annealing at 350° C.

Some of the important requirements for using semiconductor colloidal nanocrystals in this application include a good dispersing capacity (>50 mg/ml) and adequate stability of the dispersion (at least one week). Although there are many reports to synthesize different kinds of nanocrystals, there is a need for colloidal nanocrystal systems which can meet these requirements.

Zinc oxide (ZnO) is an environmentally friendly transparent semiconductor with a large band gap of 3.37 eV. TFT devices based on polycrystalline ZnO as active layer have been reported with mobility of around 0.2-3 $cm^2V^{-1}s^{-1}$.[17, 18-21] Most fabrication methods use a sputtering process to grow ZnO films. Solution-processing techniques have also been used to fabricate ZnO devices, but have suffered from poor device performance[20] or the need to use high annealing temperature (700° C).[21] ZnO nanospheres can be dispersed at high concentration beyond 75 mg/ml for solar cell applications as shown in recent reports.[22, 23]

The shape of ZnO and other nanocrystals can be controlled from nanosphere to nanorods by adjusting the growth time. [24] Compared to the more commonly studied spherical colloidal nanocrystals nanorods have an elongated cylindrical shape with typical diameters of 3-10 nm and length of 10-100 nm.

The assembly of colloidal nanorods has been studied by Li et al.[25, 26] They used drop-casting to prepare nanorod crystals onto an electron-microscopy grid, and also used capillaries to study the formation of a lyotropic liquid crystalline phase of the nanorod solution. However, they did not report formation of large-area, continuous films of nanorods, nor did they incorporate the nanorods into electronic devices.

The present specification discloses a method for improving the performance and field-effect mobility of a TFT based on a thin; solution-deposited film of an inorganic nanoparticle-based semiconducting material.

According to an aspect of the present invention there is provided an electronic switching device having a semiconducting layer that comprises inorganic semiconducting elongate nanoparticles having a longer dimension and a shorter dimension, the average ratio of the length of the longer dimension to the length of the shorter dimension for the nanoparticles of the layer being in the range 2 to 50 and the average length of the longer dimension of the nanoparticles of the layer being less than 1000 nm, wherein the nanoparticles of the layer are generally mutually aligned.

Preferably the electronic switching device further comprises first and second contacts defining a current transport path through the semiconducting layer extending there between, the nanoparticles being generally aligned along the direction of the current transport path.

Preferably the distance between the first and second contacts defines a channel length and the ratio of the channel length to the average length of the longer dimension of the nanoparticles of the layer is larger than 1.

Preferably the nanoparticles are uniaxially aligned within one or more domains having a diameter greater than 1000 nm.

Preferably at least some of the nanoparticles are fused together.

Suitably the nanoparticles are semiconducting oxide nanoparticles. Many oxide semiconductors exhibit stable surface composition when exposed to atmosphere and moisture, and do not oxidize when exposed to air and moisture during growth or film deposition. Examples of suitable oxide semiconductors include zinc oxide, tin oxide, zinc tin oxide, indium oxide, zinc indium oxide, or indium gallium zinc oxide nanoparticles. Provided that care is taken to avoid surface oxidation also other, more reactive semiconductors such as; but not limited to, Si, Ge, SiGe, GaAs, InP, InAs, ZnS, ZnSe, ZnTe, CdS, CdSe, CdTe, HgS, HgSe, HgTe, PbS, PbSe, PbTe, $SnS_2$, $SnSe_2$, $SnTe_2$ can be used.

Preferably the mobility of the semiconducting layer is at least $0.5\ cm^2V^{-1}s^{-1}$.

Preferably the density of the film is at least 50%, more preferably more than 80%, of the bulk density of the inorganic material of which the nanoparticles are comprised.

According to an aspect of the present invention there is provided a method for fabricating a film of nanoparticles on a substrate, the method comprising: forming a dispersion of elongate inorganic nanoparticles in a solvent, the nanoparticles having one or more ligand molecules attached to their surface, the nanoparticles having a longer dimension and a shorter dimension, and the ligand molecules including a functional group that enhances the stability of the dispersion of the nanoparticles in the solvent; and causing the nanoparticles to be deposited onto the substrate from the dispersion by removal of the solvent at a surface of the dispersion.

Preferably the ligands are organic or partly organic.

Suitably the semiconducting nanoparticles comprise an oxide semiconductor. The oxide semiconductor may be zinc oxide, tin oxide, zinc tin oxide, indium oxide, zinc indium oxide or indium gallium zinc oxide.

Preferably the ligands are selected so as to cause the concentration of nanoparticles to be higher at the surface of the solution than in the bulk of the solution, and the shape of the nanoparticles is selected so as to promote mutual alignment of the nanoparticles.

Preferably the ratio of the length of the longer dimension to the length of the shorter dimension for the nanoparticles in solution is in the range 2 to 50 and the average length of the longer dimension of the nanoparticles in solution is less than 1000 nm.

Preferably the solvent is removed at a surface of the solution in such a way so as to define a direction of preferential orientation for the nanoparticles and cause the nanoparticles to become at least partially aligned along that direction.

Suitably the film defines a geometric plane and the direction is out of the geometric plane defined by the film. Alternatively the direction lies in the geometric plane defined by the film.

Preferably the direction of preferential orientation is defined by the flow of solvent during removal of the solvent at a surface of the solution.

Preferably the concentration of the nanoparticles in the solvent is at least 5 mg/ml.

Preferably the solution has a lower surface tension than the pure solvent due to the presence of the ligands in the solution.

Suitably the ligands are one or more of octylamine, butylamine, hexylamine, and any other alkylamine. The ligands may be bound to the surface of the nanoparticles by a chelating bond.

Suitably the solvent is a mixture of solvents, such as a mixture of a polar solvent which exhibits a favourable interaction with the bare surface of the nanoparticles and a nonpolar solvent which exhibits a favourable interaction with the ligand molecule. Suitably, the solvent is a mixture of an alcohol solvent and an organic solvent, such as a mixture of chloroform and methanol.

Preferably, subsequent to causing the nanoparticles to be deposited from solution, the film is heated so as to remove the ligands. Preferably said removal of ligands occurs by heating the film at a temperature less than 250° C. Said heating step may be induced by thermal annealing or by irradiation with light absorbed by the nanoparticles.

Preferably, subsequent to removing the ligands, the film is immersed in a growth solution of nanoparticles in a solvent. Preferably the growth solution is a hydrothermal growth solution. Suitably the hydrothermal growth solution is an aqueous solution comprising zinc nitrate and ethylenediamine.

Preferably the growth solution is heated at a temperature below the bulk melting point of the nanoparticle material so as to cause at least some of the nanoparticles to fuse together. Suitably the temperature to which the film is heated is less than 100° C.

Preferably, subsequent to immersing the film in a growth solution, the film is heated so as to cause annealing of the nanoparticle film. Suitably, subsequent to immersing the film in a growth solution, the film is heated so as to cause annealing of the nanoparticle film. Suitably the film is heated under an atmosphere predominantly comprising nitrogen and hydrogen gases. Suitably the annealing temperature to which the film is heated is less than 250° C.

Suitably the nanoparticles are deposited by means of one of spin coating, drop coating and blade coating, or by a direct printing process such as inkjet printing, offset printing, gravure printing, flexographic printing or screen printing. The nanoparticles may be deposited in a continuous or as a patterned but locally continuous film.

Suitably the nanoparticles are semiconducting. Suitably the nanoparticles are zinc oxide nanoparticles.

Said film of nanoparticles may form part of the active layer of an electronic device. The electronic device may further comprises first and second contacts defining a current transport path through the semiconducting layer extending therebetween, the nanoparticles being generally aligned along the direction of the current transport path.

Said electronic device may be an electronic switching device. Said electronic device may be a diode, such as a light-emitting, light-sensing or photovoltaic diode.

Suitably the elongate nanoparticles are aligned with their long dimension preferentially oriented in the plane of the substrate. Alternatively the elongate nanoparticles may be aligned with their long dimension preferentially oriented normal to the plane of the substrate.

Preferably the field-effect mobility of the active semiconducting layer is at least $0.5\ cm^2V^{-1}s^{-1}$.

Preferably the distance between the first and second contacts defines a channel length and the ratio of the channel length to the average length of the longer dimension of the nanoparticles of the layer is larger than 1.

Preferably the removal of the solvent occurs when the dispersion is in contact with the substrate.

According to an aspect of the present invention there is provided a method for fabricating a film of nanoparticles, the method comprising: forming a dispersion of elongate nanoparticles in a solvent, the nanoparticles having a longer dimension and a shorter dimension and having one or more ligand molecules attached to their surface; and causing the nanoparticles to be deposited from the dispersion by removal of the solvent at a surface of the dispersion; wherein the ligand molecules are selected so as to cause the concentration of nanoparticles to be higher at the surface of the solution than in the bulk of the solution, and the shape of the nanoparticles is selected so as to promote mutual alignment of the nanoparticles.

According to an aspect of the present invention there is provided an active semiconducting layer that comprises inorganic semiconducting elongate nanoparticles having a longer dimension and a shorter dimension, the average ratio of the length of the longer dimension to the length of the shorter dimension for the nanoparticles of the layer being in the range 2 to 50 and the average length of the longer dimension of the nanoparticles of the layer being less than 1000 nm, wherein the nanoparticles of the layer are generally mutually aligned.

Preferably the nanoparticles are uniaxially aligned within domains having a diameter greater than 1000 nm.

Preferably at least some of the nanoparticles are fused together.

Suitably the nanoparticles are zinc oxide nanoparticles.

Preferably the mobility of the semiconducting layer is at least $0.5\ cm^2V^{-1}s^{-1}$.

According to a first aspect of the present invention an electronic switching device is disclosed, wherein the active semiconducting layer is formed from inorganic colloidal semiconducting nanorods deposited from liquid phase. Compared to spherical colloidal crystals nanorods allow achieving better device performance because of a smaller number of grain boundaries in the film.

Compared to long nanowires, which typically have a length exceeding 1 µm, and do not allow formation of stable dispersions, the nanorods can be formulated into stable dispersion with concentrations exceeding 10 mg/ml and processed from solution by techniques such as spin-coating, or other common large-area coating techniques.

To obtain a stable nanoparticle dispersion the long dimension of the nanorods L (for example, in the case of a cylindrical nanorod L is the length of the rod) is preferably less than 1 µm, more preferably less than 500 nm, most preferably less than 300 nm. These dimensions may refer to the size of each nanorod, or to the average size of all nanorods in the dispersion.

Preferably, the ratio between the small dimension of the nanorod D (for example, in the case of a cylindrical nanorod D is the diameter of the rod) and the long dimension of the nanorod is in the following range: 2<L/D<50. More preferably, the ratio L/D is in the range 5<L/D<20.

Preferably, the long (longer) dimension of the nanoparticles is in range of 10 nm<L<300 nm, and the small (shorter) dimension of the nanoparticles is in the range of 3 nm<D<50 nm. The longer dimension of a nanoparticle may be its longest dimension. The shorter dimension of a nanoparticle may be its shortest dimension. The shortest dimension is preferably transverse to the longer dimension. Preferably the nanoparticle is rod-shaped.

Where dimensions, ratios and figures are given herein for a plurality of nanoparticles, such as those nanoparticles comprising a semiconducting layer or film, those dimension, ratios and figures should be taken to be averages over the relevant population of nanoparticles (i.e. those nanoparticles actually comprising a semiconducting layer or film). The average values may be mean, median or modal average values.

Preferably, a ligand is attached to the surface of the nanorod. The ligand is suitably an organic molecule (which could be a partly organic molecule). Preferably it comprises a polar head group which is able to form a bond with the surface of the nanorods. The ligand also preferably comprises a functional group which is soluble in the solvent used for the liquid phase deposition. The ligand molecule may be soluble in the solvent. Preferably, the bond between the ligand and the surface of the nanorods is a weak bond such that it can be broken by low-temperature annealing below typically 250° C. or by exposure to light and/or laser radiation. Preferably, the bond between the ligand and the surface of the nanorod is a chelating bond. Alternatively, the bond between the ligand and the surface is a covalent bond.

Preferably, the nanorods are aligned such that their long-axis is aligned preferentially in the plane of current flow in the electronic switching device. More preferably, the nanorods are aligned uniaxially such that their long-axis is aligned preferentially along the direction of current flow in the electronic switching device.

Preferably, the distance (preferably the typical or average distance) between neighbouring nanorods in the as-deposited films is less than the nanorod diameter, so that a dense film of nanorods is formed. This facilitates the efficient transport of charges in between nanorods. At the interface with the substrate the surface coverage of nanorods is preferably higher than 80%, more preferably higher than 90%. This is significantly higher than what can be achieved with long nanowires [14], for which the spacing between nanowires is more than 10 times the nanowire diameter, and the surface coverage is typically less than 10%.

The density of the film may be at least 50%, and more preferably more than 80%, of the bulk density of the inorganic material of which the nanoparticles are comprised.

In comparison to the longer nanowires (length>1 µm) reported in the prior art[14], which allow spanning the gap between two electrodes by a single nanowire, the use of nanorods according to the present invention means that the channel length in a typical device configuration with channel length of several µm's is more than 5-10 longer than the maximum dimension of the nanorods. Nanorods allow retaining much better dispersion properties for deposition from liquid phase and allow achieving dense, uniform films, such that in spite of the large number of grain boundaries in the channel high field-effect mobility of the transistor in excess of $0.1\ cm^2/Vs$ can be achieved.

According to a second aspect of the present invention an electronic switching device is disclosed wherein the active semiconducting layer comprises inorganic semiconducting nanorods of zinc oxide with a length between 10 m and 1 µm.

According to a third aspect of the present invention a method is disclosed for preparing a uniform film of densely packed nanorods by solution processing. By making use of a ligand that lowers the surface tension of the nanorods uniform, densely packed films of nanorods can be solution deposited by techniques such as spin coating. In these films the nanorods can be made to adopt a well defined orientation, such as in-plane or out-of plane orientation of the long axis of the nanorods depending on process conditions. In spin-coated films long ligands with lower surface tension exhibit larger domain size and more pronounced in-plane alignment of the nanorods resulting in significantly better FET device performance than short ligands. The preferential orientation of the nanorods can be influenced by the deposition process, and the presence of a liquid flow during the deposition. In spin-coated films preferential in-plane alignment of the nanorods can be achieved while in drop-cast films with slow evaporation rate nanorods are aligned preferentially normal to the substrate. In films dried slowly between two substrates in-plane alignment was found again with uniaxial nanorod alignment at the edges of the drying film.

According to a fourth aspect of the present invention a method is disclosed for forming an electronic switching device on a substrate, wherein the method comprises depositing the active semiconducting layer of the electronic switching device onto the substrate from a liquid dispersion of colloidal nanorods, and subsequently immersing the substrate into a growth solution to increase the diameter and/or length of the nanorods on the substrate.

Preferably, the as-deposited nanorods are aligned such that their long-axis is aligned preferentially in the plane of current flow in the electronic switching device, more preferably, the as-deposited nanorods are aligned such that their long-axis is aligned preferentially along the direction of current flow in the electronic switching device.

According to a further aspect of the present invention said growth solution is a hydrothermal growth solution.

The invention will now be described by way of example with reference to the following figures:

FIG. 1 shows transmission electron microscopy images of ZnO nanocrystals. (a) nanosphere with average diameter of 6 nm. (b) nanorods with average length of 65 nm long and diameter of 10 nm.

Scheme 1 shows a schematic TFT device structure.

FIG. 2 shows log-linear scale plots of linear ($V_d$=5V) and saturated ($V_d$=60V) transfer characteristics for as made TFT device with (a) 6 nm nanospheres and (b) 10 nm×65 nm nanorods without post-deposition hydrothermal growth. The devices have been annealed at a temperature of 230° C. before measuring. The channel length (L) and width (W) are 20 µm, and 1 cm, respectively. The capacitance value of the gate dielectric is 11.4 nF/cm$^2$.

FIG. 3(a) shows transfer characteristics of a device composing of nanospheres in the linear region ($V_d$=5V) and saturated region ($V_d$=60V) after post-deposition hydrothermal growth. (b) and (c) Transfer characteristics and output characteristics of a device made from nanorods after post-deposition hydrothermal growth.

FIG. 4 shows scanning electron microscope images of a ZnO film after post-deposition hydrothermal growth: (a) nanorods and (b) nanosphere. The inset in FIG. 4(a) shows a scanning electron microscope image of the as-spin-cast nanorod film. The inset in FIG. 4(b) is an atomic force microscope topography of the as-spin-cast nanosphere film. The scanning range is 1 µm×1 µm with z value of 10 nm. Figure (c) is a cross-sectional scanning electron microscope image of a nanorod film after post-deposition hydrothermal growth. Figure (d) is a plan-view image of a film deposited from a dilute concentration of nanorods after post-deposition hydrothermal growth.

FIG. 7 shows polarized optical microscopy (POM) images of (a) Butylamine-ZnO and (b) Octylamine-ZnO films prepared by spin-coating. Image (c) and (d) are top view SEM image of spin-coated ZnO films with (c) butylamine (d) octylamine ligand.

Figures 2A, 2B:
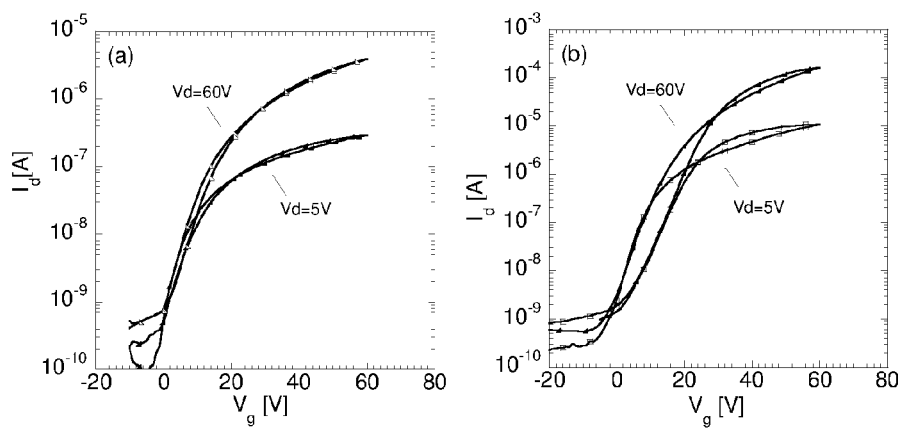

FIG. 8 shows top view of. SEM images of OCTA-ZnO film on silicon oxide/silicon substrate processed under different conditions. (a) Nanorod film fabricated drop-casting with slow (a) and high (b) evaporation rate. (c) Nanorod film dried between a glass and a Si/SiO$_2$ wafer showing the edge of the film (c) and the interior of the same film away from the edge (d). The inset in (c) shows a large-area POM image of this film.

FIG. 9 shows (a) to (c) a schematic diagram illustrating the different stages of spin-coating a solution of ZnO nanorods. Initially, nanorods are mono-dispersed in the whole drop of solution (a). When the substrate is rotating, the liquid film is thinned and due to evaporation the solute concentration on the surface is enhanced. (b). Nanorods can be aligned due to the radial fluid flow. The orange arrows indicate the upward solvent flow due to evaporation and replenishing of surface molecule. Green arrows indicate the radial flow due to the rotation of the substrate. When the solute concentration on the surface is high enough, the phase transition from isotropic to mesomorphic phase will happen in (c). (d) and (e) express that nanorods self assembly in dropping casting process. Under slow evaporation the process is dominated by vertical flow due to evaporation (d) leading to vertical alignment of the nanorods (e). (f) shows schematically the situation for solution drying between two substrates. (h) The nanorod diffusion length on the surface is amplified exponentially by the surface potential difference between nanorods in the interior bulk solvent and at the liquid-air surface. The inset illustrates a nanorod on the surface with length H penetrating above the surface of the liquid.

FIG. 10 shows saturated ($V_d$=60V) transfer characteristics for as-made TFT fabricated by spin-coating of ZnO nanorods with different ligands, solid line (OCTA-ZnO), dashed line (BUTA-ZnO). (b) Output characteristics of a device made from OCTA-ZnO nanorods. The TFT device structure is shown in the inset in (a) (bottom-gate with shadow mask evaporated Al top contacts).

Table 1 shows TFT device characteristics of as-deposited ZnO nanorod films, which were synthesized from different mole ratios between potassium hydroxide and zinc acetate. Field effect mobilities $\mu_{sat}$ were derived from the saturated region. $|V_0|$ is the turn-on voltage of the TFTs.

EXAMPLE 1

Growth of ZnO Nanorods

ZnO nanorods are prepared according to a literature method developed by Pacholski [23, 24] with some modification. 0.8182 g (4.46 mmol) zinc acetate [Zn(Ac)$_2$] and 250 µl water was added into a flask containing 42 ml methanol. The solution was heated to 60° C. with magnetic stirring. 0.4859 g (7:22 mmol, purity 85%) potassium hydroxide (KOH) was dissolved into 23 ml methanol as the stock solution which is dropped into the flask within 10-15 min. At a constant temperature of 60° C. it takes 2 hours and 15 minutes to obtain 6 nm diameter nanospheres. A small amount of water was found helpful to increase the ZnO nanocrystal growth rate. In order to grow the nanorods, the solution is condensed to about 10 ml. This was found helpful before further heating to decrease the growth time of the nanorods. Then it is reheated for another five hours before stopping the heating and stirring. The upper fraction of the solution is removed after 30 min. 50 ml methanol is added to the solution and stirred for 5 min. The upper fraction of the solution is discarded again after 30 min. This process is repeated twice. For the second time washing, the upper fraction of the solution is taken away after overnight staying. Finally, 3.3 ml chloroform and 100 µL n-butylamine are used to disperse the nanorods. The nanorods concentration is about 85 mg/ml and the solution is stable for more than two weeks. Using the modified method reported here it only takes 5 hours to obtain 65 nm long-nanorods instead of several days as reported in the literature.[24]

Transmission electron microscopy images of ZnO nanospheres (a) and nanorods (b) synthesized as above are shown in FIG. 1. The diameter of the nanospheres is about 6 nm. The nanorods have an average width of 10 nm and length of 65 nm. The nanorod length can be tuned by the reaction time. However, long nanorods (longer than 100 nm) are quite difficult to disperse into any solution. In the synthesis process, it is critical to have the correct mole ratio between KOH and $Zn(Ac)_2$. The chemical composition of as-prepared nanorods is determined by the initial mole ratio. Variations in stoichiometry affect the conductivity of the films, and the mobility and ON-OFF current ratio of the TFTs (see below).

EXAMPLE 2

Comparison Between Nanorod and Nanosphere Based TFTs

Nanocrystal films and devices are fabricated on $SiO_2$(300 nm)/Si substrates with photolithographically patterned interdigitated Cr(3 nm)/Au(12 nm) electrodes. The device structure is shown in Scheme 1. Before spin-casting the ZnO solution, the substrate is cleaned in an oxygen plasma at a power of 150 W for 2 min. The film is spin-coated from filtered (0.45 μm PTFE filter) ZnO solution with a speed of 2000 rpm. Then the devices are annealed at 230° C. in $N_2/H_2$ (V/V, 95:5) for 30 min.

Characteristics for three TFT devices made from ZnO nanorods synthesized with different mole ratios are summarized in Table 1. All devices exhibit n-type field-effect conduction. The optimized mole ratio is 1.62. It is found that the conductivity increases and mobility decreases as the stoichiometry is varied from the experimentally determined optimum mole ration in both directions. The stoichiometry can be characterized by X-ray diffraction. The (002) diffraction signal of the ZnO nanocrystals only comes from zinc atoms in the wurtzite crystal structure. It has been found that the (002) signal of the ZnO nanocrystals in their X-ray diffraction patterns is maximum if the mole ratio is near to its stoichiometric value [27], which means that there will be the lowest oxygen vacancy in this crystal structure at this ratio.

ZnO films containing a low concentration of oxygen vacancies should exhibit low conductivity because oxygen vacancies behave as deep donors.[28] Consistent with this expectation TFT devices based on this ratio show the lowest conductivity. It is worth mentioning that small variations in mole ratio do not appear to have a significant effect on the shape and size of the nanorods, but do greatly affect the TFT device performance. We believe that the large difference of TFTs'. characteristics originates in small changes of the stoichiometry of the ZnO films.

To obtain reproducible TFT performance the formation of high-quality films by techniques such as spin-coating is very important. We have found that high-quality nanocrystal films can be obtained from high concentration solutions (>50 mg/mL). The as-prepared ZnO nanocrystals comprise acetate ($CH_3COO^-$) ligand groups chelating with zinc atoms on the surface of nanocrystals. The ligands are very important to facilitate the dispersion of the nanocrystals in the solvent. For small nanospheres (approximately 6 nm), it is quite easy to achieve a high concentration solution using just the short acetate ligands. However, the acetate ligands are not sufficient to achieve high concentration dispersions of the longer nanorods. Alkylamine ligands can be used as ligands to help ZnO nanocrystal suspension.[27] When alkylamine is added to the solution, the 10×65 nm nanorods can be dispersed into chloroform with concentration as high as 90 mg/ml. For the nanospheres there is a large number of microcracks in the spin-cast films if butylamine is not added to the solution. Alkylamine ligands can be removed from the surface by low-temperature annealing at 200° C. due to their low boiling points (butylamine 78° C.) and below, and result in stable dispersion that do not aggregate or sediment for periods of days. We have found that longer alkylamine ligands (octylamine) lead to more stable dispersions than shorter ligands (butylamine). With octylamine dispersions are stable over periods of several weeks. In examples 2 and 3 we use butylamine as a ligand. A comparison between different ligands will be presented in examples 5,6 and 7.

Figure 4A:
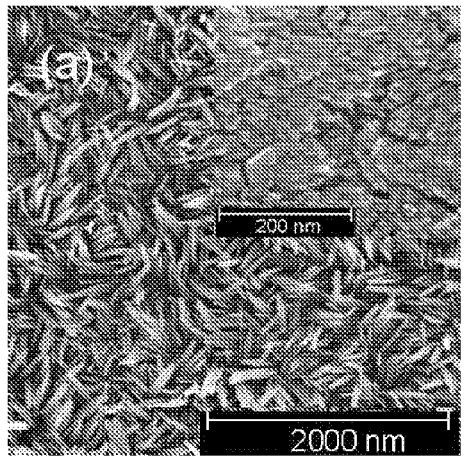

The as-prepared films are annealed under nitrogen/hydrogen atmosphere to increase mobile carrier concentration and field-effect mobility. It has been reported that hydrogen can be incorporated into ZnO films in high concentration at annealing temperatures of 200° C. and behave as a shallow donor acting as a source of conductivity.[28] At the same time, the ligand can be partly removed due to this mild heating. The characteristics of TFTs made from ZnO nanospheres (a) and nanorods (b) are shown in FIG. 2. Both TFT devices exhibit clean n-type transistor behavior with low turn-on voltage $|V_0|$=0-8V and good operating stability. For the device made from 6 nm nanospheres, the ON-OFF ratio is $5×10^3$ and the linear and saturated field-effect mobilities are $2.37×10^{-4}$ and $4.62×10^{-4}$ $cm^2V^{-1}s^{-1}$, respectively. The TFT device performance is significantly improved when nanorods are used as the active layer instead of nano spheres. These devices exhibit an ON-OFF ratio of $1.1×10^5$ and higher mobility of 0.023 $cm^2V^{-1}s^{-1}$ derived from the saturated operating region and 0.013 $cm^2V^{-1}s^{-1}$ derived from the linear region. The mobility is improved by almost two orders between a 6-nm nanosphere and a 65-nm-long nanorods. The approximately 10× larger size of the nanorod particles compared to the nanospheres will significantly reduce the number of interparticle hopping events that an electron has to undergo when moving from source to drain electrode (channel length L=20 μm). This will result in an increase of the mobility even if the nanorods are not uniaxially aligned along the direction of current flow. However, another important reason for the improved performance of the nanorod device is believed to be related to the favourable in-plane self-alignment of the colloidal nanorods when spin-coated onto the substrate as discussed below (see FIG. 4(a)).

EXAMPLE 3

Improvement of Mobility by Post-Deposition Hydrothermal Growth

The TFT device performances can be further enhanced by the post-deposition hydrothermal growth step in aqueous solution. For the additional hydrothermal growth, the substrates are immersed upside-down into a glass beaker filled with an aqueous solution containing zinc nitrate (0.025 M) and ethylenediamine (0.04 M) with slow stirring at 90° C. The devices are taken out after 50 min and rinsed with deionised water. Finally, the device is annealed at 200 ° C. for 15 min in $N_2/H_2$ atmosphere after drying with nitrogen. Electric measurements are performed in a nitrogen atmosphere to avoid any possible effect from oxygen and humidity.

Figure 3A:
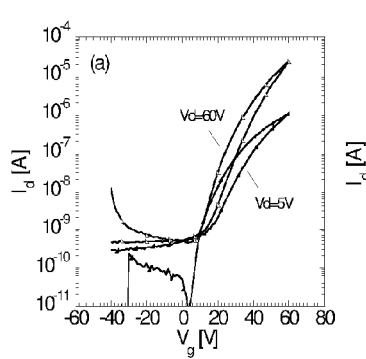
Figure 3B:
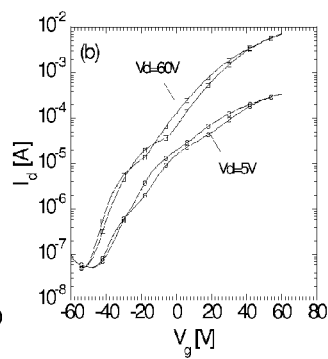
Figure 3C:
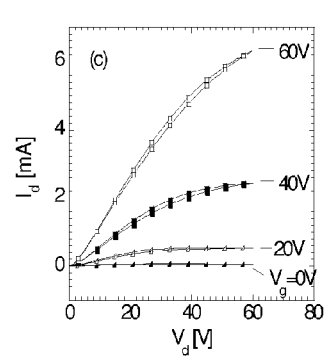

The corresponding TFT device characteristics are shown in FIG. 3(b). Devices composing of nanorods have achieved a mobility of 0.61 $cm^2V^{-1}s^{-1}$ derived from the saturated region and on/off of $3×10^5$. This performance is comparable to that of TFT devices fabricated in the same device structure by sputtering methods (mobility: 1.2 $cm^2V^{-1}s^{-1}$; on/off: $1.6× 10^6$).[18] For comparison, single ZnO nanowire transistors with mobility of 1-5 $cm^2V^{-1}s^{-1}$ have been reported.[30] For the solution-based method reported here the raw materials and deposition methods are low-cost, and the aqueous hydrothermal growth in an open vessel should be applicable to large-area substrates.

To investigate the relationship between film microstructure and device performance and to identify the mechanisms for the observed improvements of device performance we have performed scanning-electron microscopy (SEM) and atomic force microscopy (AFM) (FIG. 4). From SEM and AFM images such as FIG. 4(a) it is clear that in as-spun films the nanorods are preferentially oriented with their long-axis in the substrate plane. The interactions between the colloidal nanorods during solution growth lead to the formation of small liquid crystalline-like domains with a size on the order of 100 nm in which the nanorods are oriented parallel to each other (see inset of FIG. 4a). Similar colloidal self-organisation into nematic and smectic-A ordered solids has been reported for CdSe and $BaCrO_4$ nanorods.[25, 31-32] Due to this self-alignment of the rods the probability of encountering high-angle domain boundaries is reduced. We believe that this oriented in-plane self-assembly of the colloidal nanorods is an important factor contributing to the enhanced mobility of the as-deposited nanorod films compared to nanosphere films.

Figure 4B:
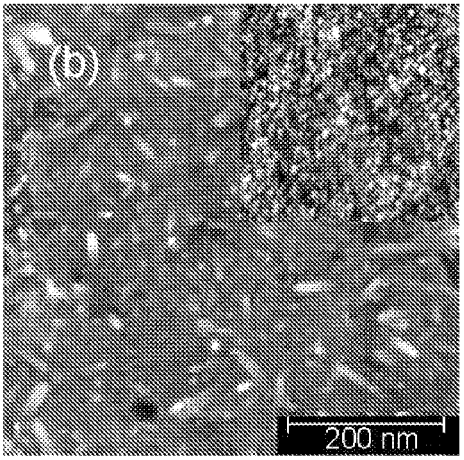
Figure 4C:
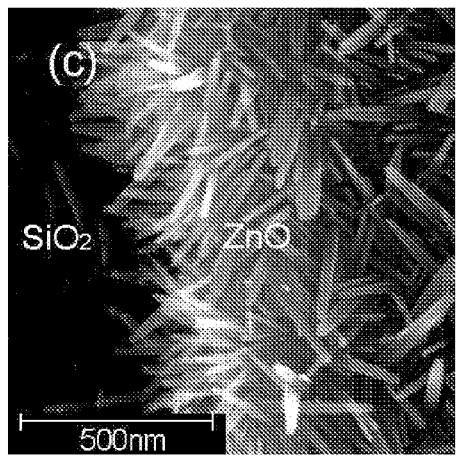
Figure 4D:
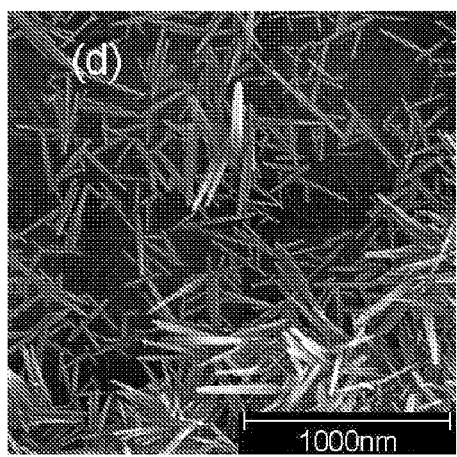

During post-deposition hydrothermal growth, the nanorods grow further along their c-axis forming longer rods, as shown in FIG. 4(c) and (d). The average final nanorod length is as long as 300 nm. Cross-sectional SEM images of the nanorod film clearly show that near the interface with the substrate the nanorods retain their favorable in-plane orientation during the post-deposition hydrothermal growth, while on the surface of the film an increasing number of nanorods grow preferably normal to the film plane. We also observe an increase in the diameter of the nanorods, which appears to be mainly occurring due to fusing of several nanorods (FIG. 4(d)). Similar increase in nanorod size has also been observed in vertically oriented ZnO arrays where microwires are formed by fusing of many nanowires.[33,34] The diameter of individual nanorods also increases slightly to about 15 nm after hydrothermal growth, but by fusing of several closely-packed nanorods the diameter can become as large as approximately 60 nm. Generally, the fusing process prefers to take place in the densely packed regions of the films in which nanorods are oriented parallel to each other. This increase in nanorod diameter and length is responsible for the observed improvement of TFT device performance after post-deposition hydrothermal growth. Here, we use a two-step approach to obtain self-aligned 300-nm-long nanorods. It is quite difficult to achieve this in a single step due to the poor dispersion properties of long nanorods or nanowires.

If the film is made from nanospheres and subjected to post-deposition hydrothermal growth the TFTs show only a small improvement of mobility to 0.0024 $cm^2V^{-1}s^{-1}$ and on/off ratio of $5\times10^4$. The mobility is more than two orders of magnitude lower than that of TFTs made from nanorods by the same fabrication process. During post-deposition hydrothermal growth the as-spin-cast nanosphere-seed film can grow into an array of ZnO wires, which are, however, aligned randomly with respect to the substrate normal.[33] This is less favourable than the in-plane orientation of nanowires obtained near the substrate interface in films deposited from a nanorod dispersion. The nanosphere films exhibit good uniformity, as shown in FIG. 4(b). When immersed in the aqueous solution, the nanospheres grow along a random direction. Some rods are perpendicular to the substrate and appear as bright spots of high electron density in the SEM image; and some rods are growing at an angle to the substrate normal achieving a limited length of about 50 nm. Although this length is comparable to that of the as-prepared nanorod films (65 nm), the TFTs made from nanosphere films subjected to hydrothermal growth exhibit about one order of magnitude lower mobility than those made from as-prepared nanorod films. This is further evidence that the alignment of the nanorods is an important factor responsible for the improved performance of devices made from nanorods.

EXAMPLE 4

Figure 5:
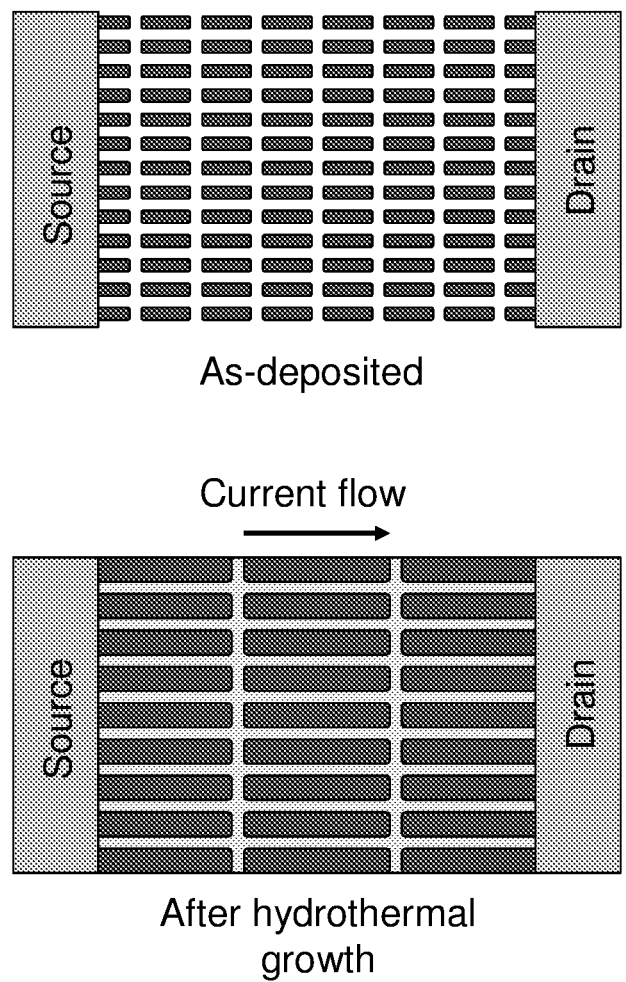
FIG. 5 shows a schematic diagram of the most preferred microstructure of the active semiconducting layer according to the present invention. The layer is composed of uniaxially aligned nanorods, and is shown before and after being subjected to a hydrothermal growth step.
Figure 6A:
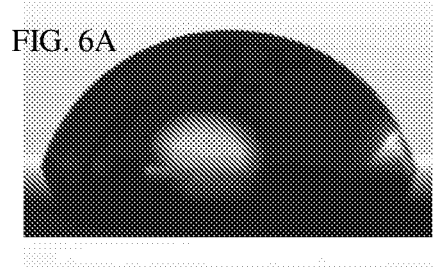
FIG. 6 shows photographs of water droplets on the surface of (a) spin coated butylamine-ZnO film and (b) octylamine-ZnO film. The left cartoon images show their responding nanorod surface ligands (c) butylamine and (d) octylamine.
Figure 6B:
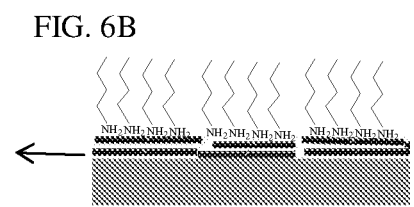
Figure 6C:
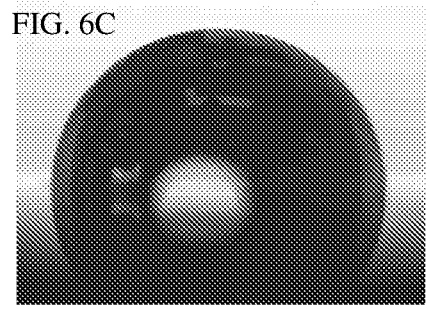
Figure 6D:
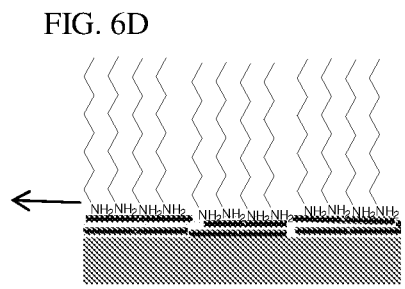
Figure 9A:
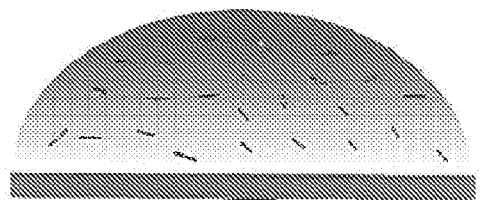
Figure 9B:
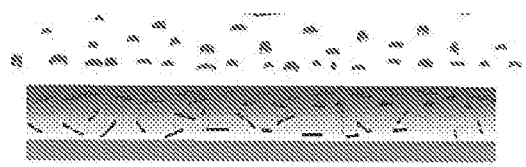
Figure 9C:
Figure 9D:
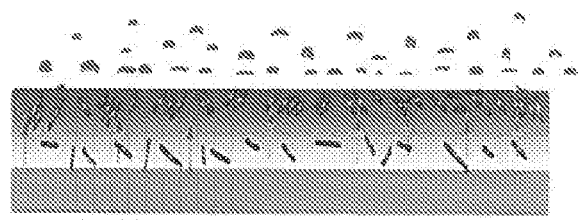
Figure 9E:
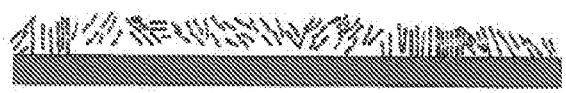
Figure 9F:
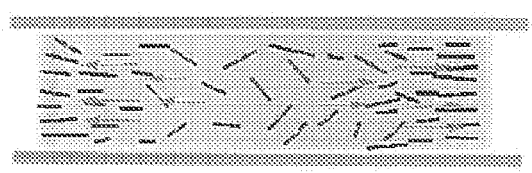
Figure 9G:
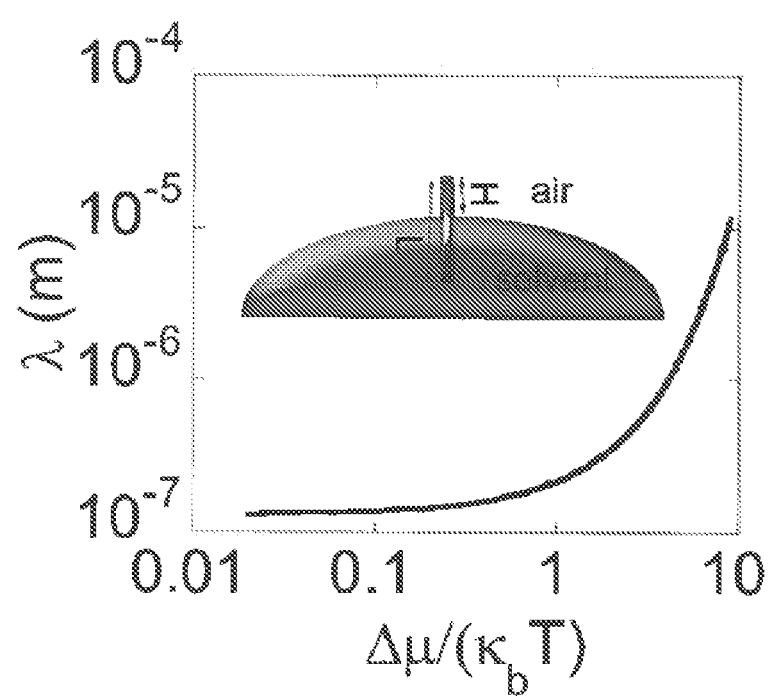

Uniaxial Liquid-Crystalline Alignment of Active Semiconductor Nanorod Layer Followed by Post-Deposition Hydrothermal Growth The above observations show the beneficial effects on the device performance, and charge carrier mobility if the long axis of the nanorods is aligned in the plane of current transport. Nanorods of the type used here have been shown to form nematic as well as smectic liquid crystalline phases, in which the nanorods are aligned uniaxially with their long axis parallel to each other in micron size domains.[25, 26] The liquid-crystalline properties of the nanorods can be used to produce uniaxially aligned films of nanorods in which the long nanorod axis is aligned along the direction of current flow in the device (FIG. 5). The structure can be either smectic or nematic, preferably smectic. In this structure optimum use is made of the fast charge transport along the long axis of the nanorod. The probability for encountering transport impeding high-angle grain boundaries is reduced. During the subsequent hydrothermal growth step the growth of larger nanowires is facilitated due to merging of several small nanorods into a larger nanowire. In this way arrays of long and aligned nanowires with a length comparable of longer than the channel length of the transistor can be grown. Note, that according to the present invention when the nanorods are deposited their length is less than fpm. As a consequence, they exhibit good dispersion properties. The network of aligned nanowires achieved after hydrothermal growth can have much larger dimensions, which would not have allowed good and stable dispersions for liquid-phase deposition.

To align the nanorods uniaxially a range of techniques known from the field of liquid-crystalline anisotropic organic molecules (as used for example, in active matrix liquid crystal displays) can be used. These include, but are not limited to, use of alignment layers with either an aligned molecular structure (such as polyamide alignment layers produced by mechanical rubbing), or aligned topographic structures/grooves, in which the nanorods align along the walls of the grooves during evaporation of the solvent. Alternatively, alignment by exposure to electrical or magnetic fields, polarised light, or through shear, flow or capillary force alignment can be used. The nanorods are formulated preferably in a solvent, in which they exhibit lyotropic behaviour, i.e. in which beyond a certain concentration of nanorods, the solution becomes liquid-crystalline at a temperature near room temperature. The concentration threshold for exhibiting lyotropic properties might be reached in the original solution, or maybe crossed by drying of solvent during deposition of the solution.

As shown in below the nanorods can also be aligned by selecting a ligand that lowers the surface tension of the nanorods and acts as a surfactant in the solvent from which the nanorods are deposited.

EXAMPLE 5

Dependence of Surface Tension of Nanoparticles on Ligand Length

The solution self-assembly of semiconducting ZnO nanorods can be sensitively controlled by the surface chemistry of the nanorods, in particular, by tuning the length of the ligand attached to the surface of the nanorods. The use of longer ligands with lower surface tension or ligands with a chemical structure that lowers the surface tension helps the formation of a well-ordered mesophase as observed by polarized microscopy and scanning electron microscopy.

To keep the nanoparticles well dispersed in an organic solvent an organic monolayer ligand is attached to the surface of the inorganic nanoparticle. For the ZnO nanorods acetate group on the surface of ZnO nanorods can be used during the initial synthesis of the nanoparticles. However, acetate group have a short chain length and can result in the nanorods being negatively charged. To make the nanorods to be dispersed in other organic solvents, butylamine (BUTA) was used as ligand. BUTA is attached on the ZnO surface by an interaction between the nitrogen atom of BUTA and the zinc atom of ZnO.

An attractive feature of this ligand is that it can be removed easily by low temperature annealing due to its neutral charge property and low boiling point. This is important for achieving efficient charge transport between the nanorods. In the present work we have used systematically alkylamine ligands with different chain length to tune the surface chemistry of the ZnO nanorods, and study the effect of the different ligand length on the self assembly properties of the nanorods.

We have found that the use of different ligand lengths results in a significant variation of the surface tension of the nanoparticles. A higher water contact angle is observed for nanorod films with longer carbon ligand. As shown in FIG. 6 for octylamine (OCTA) modified ZnO, a water contact angle of 85.0° is observed compared to 74.4° (water) for BUTA-ZnO.

The particle-air surface tensions $\gamma_{p/a}$ for different ligands are estimated from the measured water contact angles of films of nanoparticles. To do this we make use of a theoretical model [Good, R. J.; Girifalco, L. A. *J. Phys. Chem.* 1960, 64, 561-565] for estimating the liquid-particle (water/ligand) interfacial tension $\gamma_{l/p}$ from the surface tension of the particles $\gamma_{p/a}$ and the liquid $\gamma_{l/a}$:

$$\gamma_{l/p} = \gamma_{p/a} + \gamma_{l/a} - 2\phi(\gamma_{p/a}\gamma_{l/a})^{1/2} \quad (1)$$

By using equation (1) and Young's equation, $\gamma_{p/a} = \gamma_{l/a}\cos\theta + \gamma_{l/p}$, $\gamma_{l/p}$ can be eliminated and using the known liquid-air surface tension $\gamma_{l/a}$ for water $\gamma_{p/a}$ can be expressed as:

$$\gamma_{p/a} = \gamma_{l/a}(1+\cos\theta)^2/(4\phi^2) \quad (2)$$

The parameter $\phi$ can be shown to be determined by the molar volume of the particle $V_p$ and liquid $V_l$:

$$\phi = 4(V_p V_l)^{1/3}/(V_p^{1/3}+V_l^{1/3})^2 \quad (3)$$

The parameter $\phi$ can be obtained if the particle molar volume $V_p$ values is estimated from the corresponding ligand alkylamine molar volume because the effective interface is that between the liquid and the ligand molecules on the surface.[1] The parameter $\phi_{water/BUTA}$ value of 0.924 is obtained according equation (3) to determine interfacial energy between water and BUTA-ZnO. In the same way, $\phi_{water/OCTA}$ value is 0.875 for that between water and OCTA-ZnO. We can estimate $\gamma_{p/a}$ for different ligands using Equation 2 and the known surface tension of 71.98 mJ/m² of water. We find that there is a difference of 6.16 mJ/m² between the surface tension of BUTA-ZnO ($\gamma_{p/a}^{BUTA}$=33.94 mJ/m²) and that of OCTA-ZnO ($\gamma_{p/a}^{OCTA}$=27.78 mJ/m²).

Using these values for the surface tension of the ligand modified nanorods we then can apply Equation 1 again to the case of the nanorod solution in chloroform/methanol and calculate the interface tension between the nanorods and the solvent using the appropriate values of $\phi$ for chloroform/methanol as the solvent. Here the liquid is chloroform/methanol and its surface energy $\gamma_{l/a}$ is 26.74 mJ/m² which is in between the surface energy of methanol $\gamma_{methanol/air}$=22.98 mJ/m² and that of chloroform $\gamma_{chloroform/air}$=28.02 mJ/m² as determined by the ring method. We have not been able to observe surfactant action of the alkylamine molecule in the chloroform/methanol solvent, i.e., no lowering of the solvent surface tension compared to that of the pure solvent was observed when alkylamine molecules were dissolved at a concentration of 1.5%, V/V in chloroform/methanol. The interfacial free energy value for the chloroform/methanol-BUTA-ZnO interface is $\gamma_{p/l}^{BUTA}$=0.670 mJ/m² based on the parameter $\phi_{solvent/BUTA}$=0.996. Similarly, the interfacial free energy from chloroform/methanol-OCTA-ZnO ($\gamma_{p/l}^{oct}$) is $\gamma_{p/l}^{OCTA}$=1.21 mJ/m² for $\phi_{solvent/OCTA}$=0.978.

EXAMPLE 6

Dependence of Solution Self-Assembly on Choice of Ligand and Method of Solution Deposition We have investigated the nanorod solution self assembly for different film deposition techniques as a function of ligand length, and have compared in particular spin-coating and drop-casting. ZnO nanorods with alkylamine ligands can be well dispersed in chloroform/methanol solvent with high concentration (up to 50 mg/ml) enabling formation of uniform thin films by spin coating. When solutions of ZnO nanorods with different ligand lengths are spin-coated on the substrate, the resulting films exhibit a strong variation of microstructure depending on the length of the ligand. In OCTA-ZnO films with low surface free energy. clear optical contrast is observed in POM images with crossed polarizers indicating the presence of large crystalline domains with uniaxial alignment of the nanorods on a length scale of several 1-10 μms (FIG. 7(b)). In contrast in BUTA-ZnO films the crossed-polarizer images are uniformly black suggesting that the film is more optically isotropic, i.e., that crystalline order in the film is either absent or occurs on a submicrometer length scale that is too short to be observable by POM (FIG. 7(a)). In hexylamine(HEXA) modified ZnO intermediate behaviour with optical contrast somewhat weaker and occurring on a shorter lengths scale than in films of OCTA-ZnO was observed (not shown).

The origin of the optical contrast in the POM image was investigated by SEM. The images show clearly that using the method according to the present invention it is possible to form uniform, densely packed films of nanorods by simple solution coating techniques such as spin-coating. In all spin-coated films we observed preferential in-plane alignment of the long-axis of the nanorods (FIG. 7(c) and (d)). However, in the OCTA-ZnO films large domains are present in which the nanorods are aligned uniaxially parallel to each other in the plane of the film. Only a few domain boundaries are visible in the SEM image of FIG. 7(d). In contrast, in the BUTA-ZnO case (FIG. 7(c)) although the nanorods are also aligned preferentially in the plane of the film, only much smaller domains are present, and over a length scale of 1 μm the orientation of the nanorods appears isotropic. The SEM observations explain the optical contrast observed in POM, and show clearly that the ligand length has an important influence on the ability of the nanorods to form large-scale uniaxially oriented microstructures.

Different behaviour was observed in the case of drop-casting. When a droplet of nanorod OCTA-ZnO solution was dried on the substrate with a slow evaporating rate we observed preferential out-of-plane alignment of the nanorods in contrast to the in-plane alignment observed in spin-coated films. In some areas well-defined smectic ordering was observed that manifests itself in well-defined steps on the surface of the film with a step height of 90 nm equal to the length of the nanorods (FIG. 8(a)). When the films were drop-cast under fast evaporation conditions a more disordered structure with more random orientation of the nanorods resulted (FIG. 8(b)).

We also investigated the drying of a drop of nanorod solution in between two substrates (bottom SiO$_2$/Si wafer and top quartz substrate), such that the free solution-air interface was not present, and evaporation occurred at the edges of the liquid film stacked between the two substrates. Under such conditions a well ordered nanorod structure can be observed where nanorods are again oriented parallel to the substrate as in spin-coated films. In the vicinity of the edges of the film the nanorods are aligned uniaxially perpendicular to the contact line. In some areas clear evidence for smectic ordering was obtained, as shown in FIG. 8(c). This well ordered assembly takes place at the edge of the drying solution where solvent evaporation leads to a liquid flow in the plane of the film perpendicular to the contact line. POM images of a drop of OCTA-ZnO nanorods dried between the two substrates show bright contrast at the edges of the film a combined effect of the uniaxial, in-plane alignment of the nanorods and the increased thickness of the film near the edge. The films made in this way are not continuous though (see inset of FIG. 8(c). In areas of the films which are more than a few μms away from the contact line in-plane nanorod alignment without uniaxial alignment along a preferred direction is observed (FIG. 8(d)). By comparing substrates with and without surface treatment using self-assembled monolayers, such as HMDS, we found that the orientation and assembly of the nanorods is. not sensitive to the substrate surface tension. These observations suggest that the liquid flow in the drying solution and the presence of the liquid-air interface play important roles in determining nanorod self assembly.

Without wanting to be bound by theory the self-assembly behaviour is believed to be determined by the segregation and nucleation of the nanoparticles to the liquid/air interface. The driving force for nanorod segregation to the surface can be estimated by calculating the change of surface potential Δμ when a nanorods segregates from the bulk of the liquid to the surface. For the purpose of this estimate we assume that the nanorods on the surface are oriented vertical to the surface due to vertical liquid flowing, and that a length H of the long axis of the nanorods (total length L, radius R) is protruding out of the surface and is in contact with air (see Scheme 9(h)). There are three contributions to the surface potential of a nanorod on the surface measured with respect to that of the surface of the pure liquid.

a) Surface potential of nanorod/air interface:

$$\mu_{p/a} = \gamma_{p/a} \cdot (\pi R^2 + 2\pi R H) \tag{4}$$

b) Surface potential of nanorod/liquid interface:

$$\mu_{p/l} = \gamma_{p/l} \cdot [\pi R^2 + 2\pi R(L-H)] \tag{5}$$

c) Negative surface potential due to the portion of the liquid/air interface that has been displaced by the nanorods:

$$\mu_{l/a} = \gamma_{l/a} \cdot \pi R^2 \tag{6}$$

The total surface potential can be written:

$$\mu_{total} = \pi R^2 (\gamma_{p/a} + \gamma_{p/l} - \gamma_{l/a}) + 2\gamma_{p/l} \pi RL + H \cdot 2\pi R(\gamma_{p/a} - \gamma_{p/l}) \tag{7}$$

The liquid is chloroform/methanol in this case. The surface potential $\mu_{total}$ will be a minimum value $\mu_{min}$ if H=0, and only the end surface of the nanoparticle is exposed to air since $(\gamma_{p/a} - \gamma_{p/l}) > 0$:

$$\mu_{min} = \pi R^2(\gamma_{p/a} + \gamma_{p/l} - \gamma_{l/a}) + 2\gamma_{p/l} \pi RL = \gamma_{l/a}[\pi R^2(x+y-1) + 2y\pi RL] \tag{8}$$

with $x = \gamma_{p/a}/\gamma_{l/a}$ and $y = \gamma_{p/l}/\gamma_{l/a}$. In comparison, the surface potential $\mu_{liquid}$ of a nanorod totally immersed in liquid is $$\mu_{liquid} = \gamma_{p/l} \cdot (2\pi R^2 + 2\pi RL) \tag{9}$$

The potential barrier for nanoparticles to segregate from the bulk liquid to the surface $\Delta\mu_l$ is $$\Delta\mu_l = \mu_{liquid} - \mu_{min} = \pi R^2(\gamma_{p/l} - \gamma_{p/a} + \gamma_{l/a}) = \pi R^2 \gamma_{l/a}(y-x+1) \tag{10}$$

Here, the average values for ZnO nanorods are R=5.5 nm and L=92 nm and the difference in size due to nanorods ligands is neglected. In the BUTA-ZnO case, since x=1.269 and y=0.0251, $\Delta\mu_l^{BUTA} = 0.244\pi R^2 \gamma_{l/a}$ is obtained from Equation 10 respectively, i.e. there is no driving force for the particle to expose a portion of its surface to air. However, in the case of OCTA-ZnO, $\Delta\mu_l^{BUTA} = 0.063\pi R^2 \gamma_{l/a}$ can be calculated using x=0.955 and y=0.0433, and this constitutes a potential for trapping the particle at the surface.

In this framework we can rationalize the observed assembly and alignment of the nanorods under different deposition conditions in the following way. We first consider the case of drop-casting at a low evaporation rate. Due to evaporation solvent molecules move towards the interface from the interior to replenish the surface liquid and the surface moves towards the substrate. At the same time nanorods diffuse in solution. Under the conditions used here the diffusion velocity is slower than the velocity of the moving solid-air surface, and therefore nanorods from the interior of the solution are swept towards the surface. The flux of nanorods impinging onto the surface is given by f=c·v, where c and v are the concentration and flow rate of nanorods with respect to the surface, respectively. According to the Onsager-Flory rigid rod model [37] at sufficiently low concentration of the rods in solution, the rod orientation is isotropic. However, as the concentration increases, it becomes increasingly difficult for the rods to point in random directions and a concentrated solution of nanorods will undergo a phase transition into a lyotropic liquid crystalline phase in which the nanorods are aligned uniaxially along a director. This phase transition is expected to occur at a critical volume ratio of nanocrystals to solvent of $\phi_0 = c \cdot D/L$, where c is a constant with a value c=4.5 for the Onsager model and c=12.5 for the Flory model. D is the rod diameter and L its length. The colloidal nanorod solution is expected to satisfy the assumptions made by the rigid rod model. [37]

A nanorod is considered to be trapped at the liquid-air interface if $\Delta\mu_l$ is positive, and the surface potential change $\Delta\mu_l$ is closely related to the diffusion length λ of the nanorods on the surface $\lambda^2 = 2L^2 \exp[\Delta\mu_l/k_b T]$ where $k_b$ and T are Boltzmann's constant and temperature. For the above values of $\Delta\mu_l$ this relationship shows that small changes of surface potential change due to differences in surface tension between different ligands can result in large differences of diffusion length, as shown in Scheme 9(h). For the BUTA-ZnO, the surface potential change value is negative, which means the nanorods have to overcome a potential bather from interior bulk liquid to interface. This barrier will prevent the nanorods from segregating towards the interface. In contrast, the estimated surface potential change $\Delta\mu_l^{OCTA}$ is positive, which means that a driving force exists that favors the nanorod segregation towards the air-liquid interface. Using the interfacial potential change $\Delta\mu_i^{oct}$=3.89 $k_bT$ we estimate the diffusion length $\lambda^{OCTA}$ to be on the order ~0.91 µm. A long diffusion length is closely related to the critical concentration $\phi_0$ for the liquid-crystalline phase transition. A certain minimum flow rate value $f_0$ is needed to reach this concentration, which can be estimated to be $f_0=4\phi_0 D_{diff}/\lambda^2$, where $D_{diff}$ is the diffusion constant at the liquid-air interface. From this expression it is clear that nanorods with longer diffusion length at the liquid-air interface are more likely to reach the critical concentration to undergo nucleation on the surface. This analysis suggests that the reason for the larger domain size of the OCTA-ZnO films is related to the ability of the OCTA-ZnO nanorods to undergo nucleation at the air-liquid interface. In the case of nanorods which do not have a tendency to segregate to the surface, such as BUTA-ZnO it is more likely that nucleation occurs in the bulk of the liquid leading to poorer alignment of the nanorods.

Within this framework once the lyotropic solution has formed on the drying surface the orientation of the nanorods is expected to be determined by flow alignment due to the solution flow on the surface. This explains why in the case of drop casting the preferred orientation of the nanorods is perpendicular to the substrate since in this case the dominant solution flow is due to evaporation and is normal to the surface (Scheme 9(d)). In the case of the nanorod solution drying between two substrates (Scheme 9(f)) the nucleation is expected to occur at the edges of the drying film where solvent can escape between the two substrates, and where the concentration is highest. Here the solution flow is in the plane perpendicular to the edge and this explains the strong uniaxial alignment, and in some cases even smectic alignment of the rods near the edge of the film. This observation also supports the conclusion that under these conditions the transition from isotropic phase to lyotropic phase happens preferentially at the liquid-air interface where the concentration is highest and not in the bulk interior of the solution.

The case of drop-casting with high evaporation rate (FIG. 8(b)) is more complex to explain. Here we observed a complex alignment motive with small domains that adopt either in-plane, out-of-plane or tilted alignment of the nanorods. This might be related to a complex pattern of liquid flow on the surface. In this situation one would expect to observe a normal component of the flow due to replenishment of solvent evaporating at the surface, a lateral flow along the substrate to transport liquid to the edges of the film that have a higher evaporation rate (coffee-stain effect). It is also possible that convective flow cells might be formed driven by either a temperature gradient or a concentration gradient on the surface caused by the evaporation of solvent. An alternative explanation for the non-uniform alignment under such process conditions is that nucleation occurs in the bulk of the solution at a stage when the film is still thick enough, such that capillary forces do not force in-plane alignment of the rod (see discussion below).

The case of spin-coating is also complex. The factors that control coating deposition in the spin coating process have been extensively studied [38-42] and include the solution concentration, density, viscosity, surface free energy, solution evaporating rate and rotation speed. When a film is fabricated by spin casting from nanorod solution with high solvent drying rate the liquid flow has both an in-plane component due to rotation of the substrate as well as an out-of plane component due to evaporation at the surface. The spin coating process can be divided into several stages. In the early stages the process is determined by the radial convection flow due to the rotation of the substrate leading to initially rapid thinning of the film while the solute concentration in the liquid remains constant. The radial flow velocity is highest on the surface and drops to zero at the interface with the solid substrate. As the film thins the radial flow velocity and the film thinning rate due to convection slow down, and evaporation of solvent at the surface begins to make an increasingly important contribution to the thinning of the film. In this stage the solute concentration on the surface is expected to become larger than the concentration in the bulk. Finally, the radial flow comes almost to a halt and solvent evaporation results in rapid increase of solute concentration in the film. Several factors might lead to preferential in-plane alignment of the nanorod solution in this process. If the nanorods have a strong tendency to segregate to the surface of the liquid film driven by their low surface tension in the case of OCTA-ZnO it is possible that the critical concentration for forming a lyotropic phase on the surface is reached at a stage when there is still a sufficiently high, in-plane radial flow velocity to align the nanorods in the plane (scheme 9(c)). Ideally, in this situation one might expect a uniform radial alignment of the rods. This is clearly not observed (FIG. 7), however, it is possible that such radial flow alignment is not preserved when the liquid crystalline phase solidifies and crystalline domains with random orientation of the nanorods in the plane nucleate. A second reason for the observed in-plane alignment of the rods in spin-coated films could be that the lyotropic phase forms at a point at which the film has already thinned down to a thickness that is comparable or less than the length of the nanorods. In this case capillary forces might cause the nanorods to prefer to align in the plane of the substrate. Generally, the alignment process in spin-coated films is complex. We have found for example, that in more concentrated solutions (50 mg/ml) processed by spin-coating the nanorods are not aligned in the plane, but adopt a tilted orientation with respect to the substrate. This might be an indication that in concentrated solutions nucleation occurs at a stage when the liquid film thickness is still significantly larger than the length of the nanorods.

This establishes a number of selection criteria for the ligand. of the nanorods. The ligand is preferably selected to lower the surface tension of the nanoparticles. This can be achieved in a number of ways such as using a long alky chain ligand, use of a branched ligand or by incorporating specific chemical groups such as fluorinated groups into the ligand. Preferably the ligand acts as a surfactant in the solvent which is used for deposition of the nanoparticles. This means that when the ligand molecule is dissolved in the solvent it lowers the surface tension of the solvent, i.e., by measuring and comparing the surface tension (for example, by using a Wilhelmy balance) of the solvent with and without ligand added suitable ligands that have a tendency to promote segregation of the nanoparticles to the surface can be selected. Ligands are preferred for which the surface tension of the solution with a certain concentration of ligand molecules is lower than that of the pure solvent.

Similarly, suitable ligands can also be selected by measuring and comparing the surface tension of the solvent with and without ligand modified nanoparticles. Ligands are preferred for which the surface tension of the nanoparticle loaded solution is lower than that of the pure solvent.

The ligand is also selected to have a low boiling point and relatively weak chemical bond with the surface in order to enable removal of the ligand from the surface by low-temperature annealing, typically at or below 250° C. The ligand is selected to interact favorably with the solvent used for the deposition of the nanoparticles in order to enable a high loading of nanoparticles and a stable dispersion. Finally, the length of the ligand is selected to provide an acceptable compromise between the required low surface tension of the nanoparticles and the need for a dense packing of the as-deposited nanoparticles. In the case of alkylamine ligands the use of octylamine provides such a compromise.

EXAMPLE 7

TFT performance as a Function of Ligand Length

The ability to self-assemble the nanorods into well-aligned structures can be exploited to achieve significantly improved electrical transport in solution-processed ZnO films. We can control the alignment of the nanorods in spin-coated films that can easily be integrated into FET structures, and using ligands such as OCTA-ZnO it is possible to produce films with favourable in-plane alignment of the nanorods and domain size of several μm's. Here we investigate the correlation between the field-effect transistor performance and the nanorod alignment in spin-coated ZnO films with different ligands.

FETs were fabricated in a standard bottom-gate, top-contact configuration using highly doped silicon wafers acting as gate electrodes with a 300 nm $SiO_2$ gate dielectric (FIG. 10(a)). The $SiO_2$ surface was modified by a self-assembled monolayer of hexamethyldisilazane (HMDS) prior to spin-coating of the active ZnO nanorod film. The HMDS substrate modification was found to lead to better device performance compared to films deposited onto unmodified, hydrophilic $SiO_2$. HMDS and other self-assembled monolayers render the surface hydrophobic, and are widely used in organic TFTs. We did not observe significant differences in the film morphology between films on HMDS and untreated $SiO_2$ substrates, the improvement in device performance might be related to a decrease in trap states at the ZnO/$SiO_2$ interface. After spin-coating the films were annealed at 230° C. in forming gas atmosphere to remove the ligand. The device was completed by evaporating Al top source-drain contacts through a shadow mask, which we found led to better device performance than gold contacts. Al has a workfunction that is matched well to the electron-affinity of ZnO and should exhibit only a small barrier for electron injection from Al into the conduction band of ZnO. The device channel length L and width W are L=90 μm and W=3 mm.

The transfer characteristics of the device fabricated from nanorods with different ligands are plotted in FIG. 10(a). All the devices fabricated from ZnO nanorods with different ligands show n-type behavior. The saturated mobility ($\mu_{sat.}$) is calculated by fitting a straight line to the plot of the square root of $I_d$ vs. $V_g$, according to the expression (for the TFT saturated region): $I_d=(C_i\mu_{sat.}W/2L)(V_g-V_{TH})^2$ for the case of $V_d<V_g-V_{TH}$, where $C_i$=11.4 nF/cm$^2$ is the capacitance of the 300 nm $SiO_2$ gate dielectric. $V_{TH}$ is the threshold voltage which is typically less than 20V. The TFT devices with OCTA-ZnO as active layer exhibit significantly higher performance than the films with lower ligand length. OCTA-ZnO films have saturated mobility of 0.1~0.12 cm$^2$V$^{-1}$s$^{-1}$ and an ON/OFF ratio of $10^5$~$10^6$. This is also evident from the output current-voltage characteristics of the device from OCTA-ZnO (FIG. 10(b)). The mobility extracted from the linear region ($V_d$=5V) has almost the same values as $\mu_{sat}$ suggesting a low contact resistance. The mobility value is 5-6 times higher than that of BUTA-ZnO TFT with saturated mobility of 0.015~0.02 cm$^2$V$^{-1}$s$^{-1}$. Device with HEXA-ZnO show intermediate performance. This improvement of mobility with ligand length is fully consistent with the morphological results described earlier, and shows that a high degree of in-plane nanorod alignment and a large domain size is beneficial to transport in the nanorod films. This result also provides evidence that transport in the ZnO films is not limited by residual ligands remaining on the surface of the nanorods after the annealing step since in this case one would expect the films with longer ligands to exhibit poorer performance.

We have also investigated whether the device performance can be enhanced further by subjecting the nanorod films to a post-deposition hydrothermal growth step in aqueous zinc solution. As shown in Example 3 this leads to growth of the nanorods on the substrate, fusing of the rods and results in further device improvement. Initial experiments have shown that after the hydrothermal growth step mobility values of 1.2-1.4 cm$^2$V$^{-1}$s$^{-1}$ and ON/OFF ratio of $10^6$~$10^7$ can be achieved in highly crystalline films of OCTA-ZnO.

This self-assembly methods presented here are simple, and they can be applied to solution deposition techniques which are capable of producing uniform films over large areas. Examples are techniques, such as, but not limited to, spin coating, blade coating, curtain coating, gravure coating, capillary coating, zone casting. Particularly preferred are techniques that induce a unaxial, in-plane liquid flow, which can be used to align the low-surface tension ligand-modified nanoparticles uniaxially in the plane along the direction of flow.

Alternatively, printing techniques can be used for the deposition of the low-surface tension ligand-modified nanoparticles, such as, but not limited to, inkjet printing, screen printing, offset printing, gravure printing, or flexographic-printing.

Colloidal nanorods can thus be used for solution-processed electronic devices that can achieve performance levels which are not accessible with solution-processed organic semiconductors. The techniques for nanorod self-assembly can also be applied to other devices, including optoelectronic devices. The self-assembly techniques described in the present invention can also be applied to device configurations which require an out-of-plane alignment of the nanorods, such as solar cells or light-emitting diodes.

The present invention can be applied to other inorganic semiconducting nanorod materials, including, but not limited to, nanorods based on, comprising or consisting of $SnO_2$, Si, Ge, SiGe, GaAs, GaP, InP, InAs, $In_2O_3$, ZnO, ZnS, ZnSe, ZnTe, CdS, CdSe, CdTe, HgS, HgSe, HgTe, PbS, PbSe, PbTe, $SnO_2$, $SnS_2$, $SnSe_2$, $SnTe_2$.

The processes and techniques described herein apply to the fabrication of a semiconducting layer and may be used in the manufacture of any devices that comprise a semiconducting layer, such as diodes, FETs, MOSFETs, BJTs and optoelectronic devices.

The present invention can also be applied to more complex shaped elongate nanoparticles that can be dispersed in solution, such as platelets, tetrapods, and other branched nanoparticles.[43] Such particles could be substituted for some or all of the nanorods disclosed in the above examples.

The post-deposition growth of the nanorods on the substrate, that fuses the individual, as-deposited nanorods can be performed by other solution- or vapour-phase growth techniques, such as, but not limited to, liquid phase epitaxy or chemical vapour deposition.

The present invention is not limited to the foregoing examples. Aspects of the present invention include all novel and/or inventive aspects of the concepts described herein and all novel and/or inventive combinations of the features described herein.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

REFERENCES

1. Katz, H. E. *Chem. Mater.* 2004, 16, 4748-4756.
2. Gamota, D. R.; Brazis, P.; Kalyanasundaram, K.; Zhang, J. *Printed Organic and Molecular Electronics*; Kluwer: New York, 2003.
3. Bao, Z. N. *Acs. Sym. Ser.* 2004, 874, 1-14.
4. Dimitrakopoulos, C. D.; Malenfant, P. R. L., *Adv. Mater.* 2002, 14, 99-117.
5. Sirringhaus, H.; Kawase, T.; Friend, R. H., Shimoda, T.; Inbasekaran, M.; Wu, W.; Woo, E. P. *Science* 2000, 290, 2123-2126
6. Chang, J. F.; Sun, B. Q.; Breiby, D. W.; Nielsen, M. M.; Soiling, T. I.; Giles, M.; McCulloch, I.; Sirringhaus, H. *Chem. Mater.* 2004, 16, 4772-4776.
7. Ong, B. S.; Wu, Y.; Liu, P.; Gardner, S. *Adv. Mater.* 2005, 17, 1141-1144.
8. Payne, M. M.; Parkin, S. R.; Anthony, J. E.; Kuo, C. C.; Jackson, T. N. *J. Am. Chem. Soc.* 2005, 127, 4986-4987.
9. Mitzi, D. B. *J. Mater. Chem.* 2004, 14, 2355-2365.
10. Chua, L. L.; Zaumseil, J.; Chang, J. F.; Ou, E. C.; Ho, W. P. K. H.; Sirringhaus, H.; Friend, R. H. *Nature* 2005, 434, 194-199.
11. C. Waldauf, P. Schilinsky, M. Perisutti, J. Hauch, C. J. Brabec, *Adv. Mater.* 2003, 15, 2084-2088.
12. Kagan, C. R.; Mitzi, D. B.; Dimitrakopoulos, C. D. Science 1999, 286, 945-947.
13. Mitzi, D. B.; Kosbar, L. L.; Murray, C. E.; Copel, M.; Afzali, A. *Nature* 2004, 428, 299-303.
14. Duan, X. F.; Niu, C. M.; Sahi, V.; Chen, J.; Parce, J. W.; Empedocles, S.; Goldman, J. L. *Nature* 2003, 425, 274-278.
15. Ridley, B. A.; Nivi, B.; Jacobson, J. M. *Science* 1999, 286, 746-749.
16. Goldstein, A. N.; Echer, C. M.; Alivisatos, A. P. *Science* 1992, 256, 1425-1427.
17. Xia, Y. N.; Yang, P. D.; Sun, Y. G.; Wu, Y. Y.; Mayers, B.; Gates, B.; Yin, Y. D.; Kim, F.; Yan, Y. Q. *Adv. Mater.* 2003, 15, 353-389.
18. Carcia, P. F.; McLean, R. S.; Reilly, M. H.; Nunes, G. *Appl. Phys. Lett.* 2003, 82, 1117-1119.
19. Hoffman, R. L.; Norris, B. J.; Wager, J. F. *Appl. Phys. Lett.* 2003, 82, 733-735.
20. Ohya, Y.; Niwa, T.; Ban, T.; Takahashi, Y. *Jpn. J. Appl. Phys.* 1 2001, 40, 297-298.
21. Norris, B. J.; Anderson, J.; Wager, J. F.; Keszler, D. A. *J. Phys. D Appl. Phys.* 2003, 36, L105-L107.
22. Meulenkamp, E. N. *J. Phys. Chem. B* 1998, 102, 5566-5572.
23. Beek, W. J. E.; Wienk, M. M.; Janssen, R. A. J. *Adv. Mater.* 2004, 16, 1009-1013.
24. Pacholski, C.; Komowski, A.; Weller, H. *Angew. Chem. Int. Edit.* 2002, 41, 1188-1191.
25. Li, L. S.; Alivisatos; A. P. *Adv. Mater.* 2003, 15, 408-411.
26. Li. L. S.; Walda J.; Manna L, Alivisatos; A. P., *Nanoletters* 2002, 2, 558
27. Pacholski, C. Selbstorganisation von ZnO nanoteilchen and Untersuchung der Ladungsträgerdynamik (thesis), Hamburg University, 2002
28. Van de Walle, C. G. *Phys. Rev. Lett.* 2000, 85, 1012-1015
29. Norberg, N. S.; Kittilstved, K. R.; Amonette, J. E.; Kukkadapu, R. K.; Schwartz, D. A.; Gamelin, D. R. *J. Am. Chem. Soc.* 2004, 126, 9387-9398.
30. Law, M.; Greene, L. E.; Johnson, J. C.; Saykally, R.; Yang, P. D. *Nature Mater.* 2005, 4, 455-459.
31. Talapin, D. V.; Shevchenko, E. V.; Murray, C. B.; Komowski, A.; Forster, S.; Weller, H. *J. Am. Chem. Soc.,* 2004, 126, 12984-12988.
32. Kim, F; Kwan, S.; Akana, J.; Yang, P. D.; *J. Am. Chem. Soc.,* 2001, 123, 4360-4361.
33. Greene, L. E.; Law, M.; Goldberger, J.; Kim, F.; Johnson, J. C.; Zhang, Y. F.; Saykally, R. J.; Yang, P. D. *Angew. Chem. Int. Edit.,* 2003, 42, 3031-3034.
34. Li, Q. C.; Kumar V., Li, Y.; Zhang, H. T.; Marks, T. J.; Chang, R. P. H. *Chem. Mater.,* 2005, 17, 1001-1006.
35. Girifalco, L. A.; Good, R. J. *J. Phys. Chem.* 1957, 61, 904-909.
36. Bigioni, T. P.; Lin, X. M.; Nguyen, T. T.; Corwin, E. I.; Witten, T. A.; Jaeger, H. M. *Nat. Mater.* 2006, 5, 265-270.
37. Chandrasekhar, S. *Liquid Crystals*($2^{nd}$ *edition*), Cambridge University Press (Cambridge), 1992.
38. Bornside, D. E.; Macosko, C. W.; Scriven, L. E. *J. Appl. Phys.* 1989, 66, 5185-5193.
39. Emslie, A. G.; Bonner, F. T.; Peck, L. G. *J. Appl. Phys.* 1958, 29, 858-862.
40. LAWRENCE, C. J. *Phys. Fluids* 1988, 31, 2786-2795.
41. Ohara, T.; Matsumoto, Y.; Ohashi, H. *Phys: Fluids A* 1989, 1, 1949-1959.
42. Birnie, D. P. *J. Mater. Res.* 2001, 16, 1145-1154.
43. Kanaras; A. G., Sonnichsen C., Liu, H., Alivisatos A. P., *Nanoletters* 2005, 5, 2164-2167.

The invention claimed is:

1. A method for fabricating a film of nanoparticles on a substrate, the method comprising:
    forming a dispersion of elongate inorganic nanoparticles in a solvent, the nanoparticles having one or more ligand molecules attached to their surface, the nanoparticles having a longer dimension and a shorter dimension, and the ligand molecules including a functional group that enhances the stability of the dispersion of the nanoparticles in the solvent; and
    causing the nanoparticles to be deposited onto the substrate from the dispersion by removal of the solvent at a surface of the dispersion,
    wherein the ligands are selected so as to cause the concentration of nanoparticles to be higher at the surface of the solution than in the bulk of the solution.

2. The method as claimed in claim 1, wherein the shape of the nanoparticles is selected so as to promote mutual alignment of the nanoparticles.

3. The method as claimed in claim 1, wherein the solvent is removed at a surface of the solution in such a way so as to define a direction of preferential orientation for the nanoparticles and cause the nanoparticles to become at least partially aligned along that direction.

4. The method as claimed in claim 3, wherein the film defines a geometric plane and the direction is out of the geometric plane defined by the film.

5. The method as claimed in claim 3, wherein the film defines a geometric plane and the direction lies in the geometric plane defined by the film.

6. The method as claimed in claim 3, wherein the direction of preferential orientation is defined by the flow of solvent during removal of the solvent at a surface of the solution.

7. The method as claimed in claim 1, wherein the solution has a lower surface tension than the pure solvent due to the presence of the ligands in the solution.

8. The method as claimed in claim 1, wherein, subsequent to causing the nanoparticles to be deposited from solution, the film is heated so as to remove the ligands.

9. The method as claimed in claim 8, wherein, subsequent to removing the ligands, the film is immersed in a growth solution of nanoparticles in a solvent.

10. The method as claimed in claim 9, wherein the growth solution is a hydrothermal growth solution.

11. The method as claimed in claim 9, wherein the growth solution is heated at a temperature below the bulk melting point of the nanoparticle material so as to cause at least some of the nanoparticles to fuse together.

12. The method as claimed in claim 9, wherein, subsequent to immersing the film in a growth solution, the film is heated so as to cause annealing of the nanoparticle film.

13. The method as claimed in claim 12, wherein the film is heated under an atmosphere predominantly comprising nitrogen and hydrogen gases.

14. A method for fabricating a film of nanoparticles, the method comprising:
   forming a dispersion of elongate nanoparticles in a solvent, the nanoparticles having a longer dimension and a shorter dimension and having one or more ligand molecules attached to their surface; and
   causing the nanoparticles to be deposited from the dispersion by removal of the solvent at a surface of the dispersion;
   wherein the ligand molecules are selected so as to cause the concentration of nanoparticles to be higher at the surface of the solution than in the bulk of the solution, and the shape of the nanoparticles is selected so as to promote mutual alignment of the nanoparticles.

15. The method according to claim 1, wherein the ligand molecules are different to the solvent.

16. The method according to claim 1, wherein the ligand molecules are organic molecules.

17. The method according to claim 1, wherein said film of nanoparticles forms a semiconducting layer of an electronic switching device.

* * * * *